United States Patent
Yang et al.

(10) Patent No.: US 8,446,176 B1
(45) Date of Patent: May 21, 2013

(54) RECONFIGURABLE ENGINEERING CHANGE ORDER BASE CELL

(75) Inventors: Jianan Yang, Austin, TX (US); Darrin L. Hutchinson, Pflugerville, TX (US); Stephen G. Jamison, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/326,556

(22) Filed: Dec. 15, 2011

(51) Int. Cl.
*H01L 25/00* (2006.01)
*H01L 27/088* (2006.01)
*H03K 19/20* (2006.01)
*H03K 19/094* (2006.01)

(52) U.S. Cl.
USPC .......................... 326/103; 326/112; 257/401

(58) Field of Classification Search
USPC .................. 326/103, 104, 112, 101; 257/401, 257/203; 716/10, 12, 19
See application file for complete search history.

(56) References Cited

U.S. PATENT DOCUMENTS

| | | | |
|---|---|---|---|
| 7,137,094 B2 | 11/2006 | Tien | |
| 7,137,096 B2 * | 11/2006 | Lin | 257/532 |
| 2008/0169486 A1 * | 7/2008 | Toyoshima et al. | 257/203 |
| 2011/0073914 A1 * | 3/2011 | Toyoshima et al. | 257/203 |
| 2011/0278681 A1 * | 11/2011 | Smayling et al. | 257/401 |
| 2012/0001655 A1 * | 1/2012 | Ciccarelli et al. | 326/103 |

* cited by examiner

*Primary Examiner* — Shawki Ismail
*Assistant Examiner* — Dylan White
(74) *Attorney, Agent, or Firm* — Hamilton & Terrile, LLP; Michael Rocco Cannatti

(57) ABSTRACT

An integrated circuit ECO base cell module is formed with PMOS and NMOS gate electrode structures and power supply lines that are electrically separated from one another up to the second metal (M2) layer in a fixed circuit structure that may be reconfigured with one or more conductor elements formed above the M2 layer to form a predetermined circuit function.

21 Claims, 10 Drawing Sheets

RECONFIGURABLE ENGINEERING CHANGE ORDER BASE CELL

BACKGROUND OF THE INVENTION

1. Field of the Invention

The present invention is directed in general to integrated circuit design. In one aspect, the present invention relates to design revision management using a base cell to implement Engineering Change Orders (ECOs).

2. Description of the Related Art

As design complexity and density increase, post silicon debugging and design correction can extend the design cycle, thereby reducing market window access and increasing revenue loss. In chip design, ECO is the process of inserting a logic change directly into the netlist after it has already been processed by an automatic tool, typically by inserting spare logic cells. However, it is difficult to find an ideal distribution of spare cells since a poorly placed spare cell would require long routing wires with increased propagation delay, and a poor selection of cell types would require more cells to fix the same error. To provide flexibility in the logic insertion process, programmable base cells have been proposed which are programmed at the contact and first metal layer and above to provide the required logic functionality, but such base cells have limited flexibility and associated performance limitations and costs.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

Figure 1:
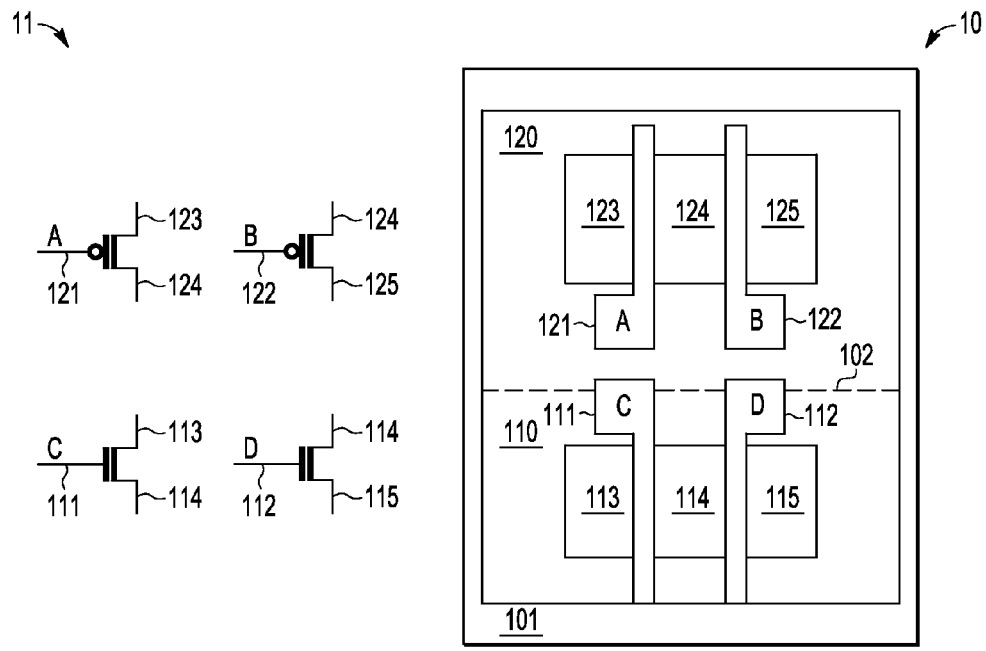
FIG. 1 depicts a simplified plan view of the substrate regions and patterned gate conductors for a first base cell configuration, along with an associated circuit schematic diagram.

A reconfigurable ECO base cell and associated design methodology are provided in which separated pull-up and pull-down networks are provided in a base cell which has a predefined substrate design and fixed conductor stack up to the second metal layer, and which may be programmed to provide a variety of different circuit configurations using only the metal and via layers above the second metal layer, thereby reducing the redesign cost and time. In selected embodiments, the reconfigurable ECO base cell includes a plurality of transistors (e.g., NMOS and PMOS transistors) and a plurality of reference voltage terminals (e.g., $V_{DD}$ and $V_{SS}$) that are implemented between the substrate and second metal layers as electrically separate elements, and that may be connected together in the conductors above the second metal layer to provide a desired circuit functionality during the ECO redesign process. In other embodiments, the reconfigurable ECO base cell includes a plurality of transistors (e.g., NMOS and PMOS transistors) and a plurality of reference voltage terminals (e.g., $V_{DD}$ and $V_{SS}$) that are implemented between the substrate and second metal layers as one or more electrically connected circuit elements that may be connected together in the conductors above the second metal layer to provide a desired circuit functionality during the ECO redesign process. With this approach, each base cell may be included in a cell library and may be built using a layout style similar to other library cells so as to have the same features and/or element configurations as the standard logic cells. By fixing the base cell design through the second metal layer, the base cell can keep the same pitch at these layers as a standard logic cell or gate array library, symmetrical in one or more directions. In addition, various base cell elements (e.g., the n-well, p-well, P+ implant, N+ implant, contact vias, first metal layers, first vias, and second metal layers) may keep the same width and height as the standard cell in the same chip. Using the upper metal layer conductors (e.g., above the second metal layer), the base cell(s) can be transformed into targeted logic cells, such as an inverter, NAND, NOR, XOR, AOI, buffer, multiplexer, latch, de-coupling capacitors (decap), etc. by programming or altering at least one of these upper metal layers. The base cells can be placed using block level or chip level auto placement. With the disclosed reconfigurable ECO base cell, there is provided an improved spare cell design and methodology that can be used for revising a chip design to accommodate a design change to overcome the problems in the art, such as outlined above.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in simplified circuit schematic form, rather than in detail, in order to avoid limiting or obscuring the present invention. In addition, selected aspects are depicted with reference to simplified plan and cross sectional views of an integrated circuit device without including every device feature or geometry in order to avoid limiting or obscuring the present invention. Such descriptions and representations are used by those skilled in the art to describe and convey the substance of their work to others skilled in the art. Various illustrative embodiments of the present invention will now be described in detail below with reference to the figures.

Referring now to FIG. 1, there is depicted a simplified plan view 10 of the substrate regions and patterned gate conductors for a first base cell configuration, along with an associated circuit schematic diagram 11 to depict the inherent circuit functionality of the base cell at this stage of manufacture. As will be appreciated, the shapes and patterns in different material layers and regions may be formed separately with any desired manufacturing processes, including but not limited to implantation, doping, deposition, photolithography, selective masking, etching, etc. In a base cell which includes both NMOS transistors and PMOS transistors, the substrate 101 is processed (e.g., with one or more masked implantation steps) to form a p-well region 110 and a separate n-well region 120 that are isolated from one another or conjoined at a junction boundary 102. In the p-well region 110, NMOS transistors may be formed by first defining a plurality of gate electrode structures 111-112 (e.g., with patterned polysilicon and gate dielectric layers) and then using the gate electrode structures 111-112, alone or in combination with sidewall spacers (not shown), to implant the N+ source/drain regions 113-115. In similar fashion, PMOS transistors may be formed in the n-well region 120 by using the defined plurality of gate electrode structures 121-122, alone or in combination with sidewall spacers (not shown), to implant the P+ source/drain regions 123-125. By separately defining the NMOS gate electrodes 111-112 and PMOS gate electrodes 121-122, the base cell allows separate pull-up and pull-down networks to be defined, thereby providing increased flexibility when programming the base cell functionality as explained more fully hereinbelow. In the corresponding circuit schematic diagram 11, the circuit elements are labeled to correspond to the gate and source/drain elements shown in the plan view 10. As depicted, the PMOS and NMOS transistors formed by the gate electrode structures 111-112, 121-122 and implant regions 113-115, 123-125 which are electrically separate elements not yet connected to any reference voltages.

Figure 2:
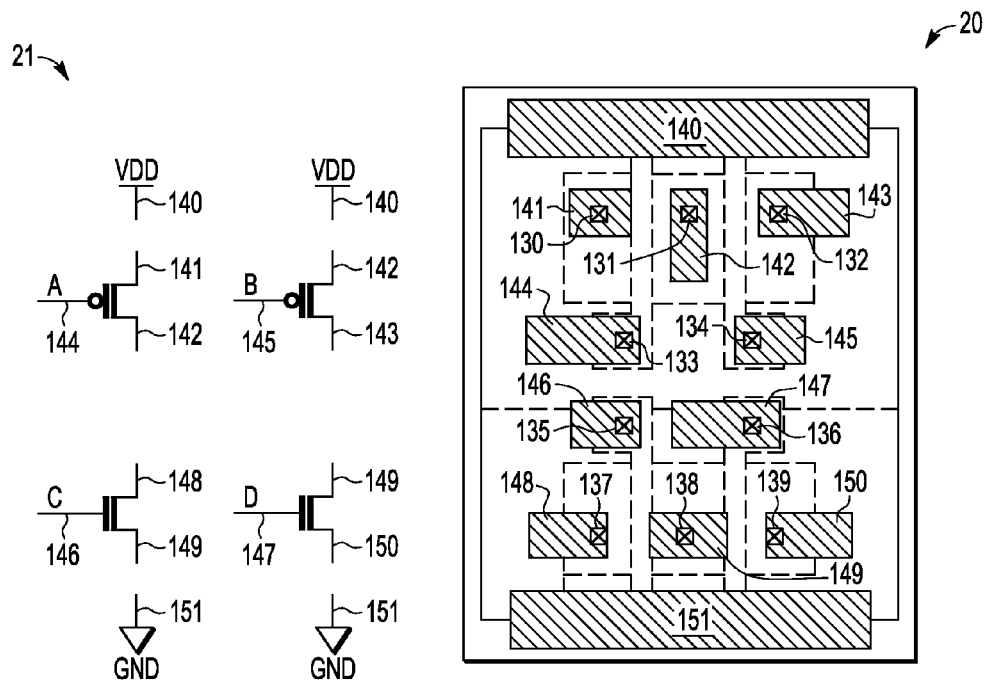
FIG. 2 depicts a simplified plan view of the contact vias and first metal layers for the first base cell configuration, along with an associated circuit schematic diagram.

Turning now to FIG. 2, there is depicted a simplified plan view 20 of the contact vias and first metal layers for the first base cell configuration, along with an associated circuit schematic diagram 21 to depict the inherent circuit functionality of the base cell at this stage of manufacture. As will be appreciated, the formation of the contact vias and first metal layers is preceded by the formation of one or more dielectric layers (not shown), such as one or more passivation layers and/or inter-layer dielectric (ILD) layers that may be deposited and polished or otherwise planarized. In the initial dielectric layer(s), conductive contacts 130-139 are formed in the base cell to provide electrical contact to the underlying gate, source, and drain terminals of the NMOS and PMOS transistors. The conductive contacts 130-139 may be formed with any desired process, such as by applying a photolithographic mask and etch process to define contact openings in the initial dielectric layer(s), depositing one or more conductive layers to fill the contact openings, and then polishing or removing the conductive layers to form the conductive contacts 130-139. After the conductive contacts 130-139 are formed, a plurality of first metal (M1) layers are formed to define a plurality of reference voltage conductors 140, 151 (e.g., $V_{DD}$ 140 and $V_{SS}$ 151) which provide the voltage supplies from a plurality of DC power sources. In addition, the patterned M1 layers 141-150 are defined to provide electrical contact to the underlying contacts to the gate, source, and drain terminals of the NMOS and PMOS transistors. The patterned M1 layers 141-150 may be formed by using a patterned photoresist mask to selectively etch one or more deposited M2 layers, or by employing an additive patterning or a "Damascene" or any other desired fabrication process. In the corresponding circuit schematic diagram 21, the circuit elements are labeled to correspond to the patterned M1 layers 140-150 shown in the plan view 20, and show that NMOS and PMOS transistors are not connected together or to the reference voltage conductors 140, 151.

Figure 3:
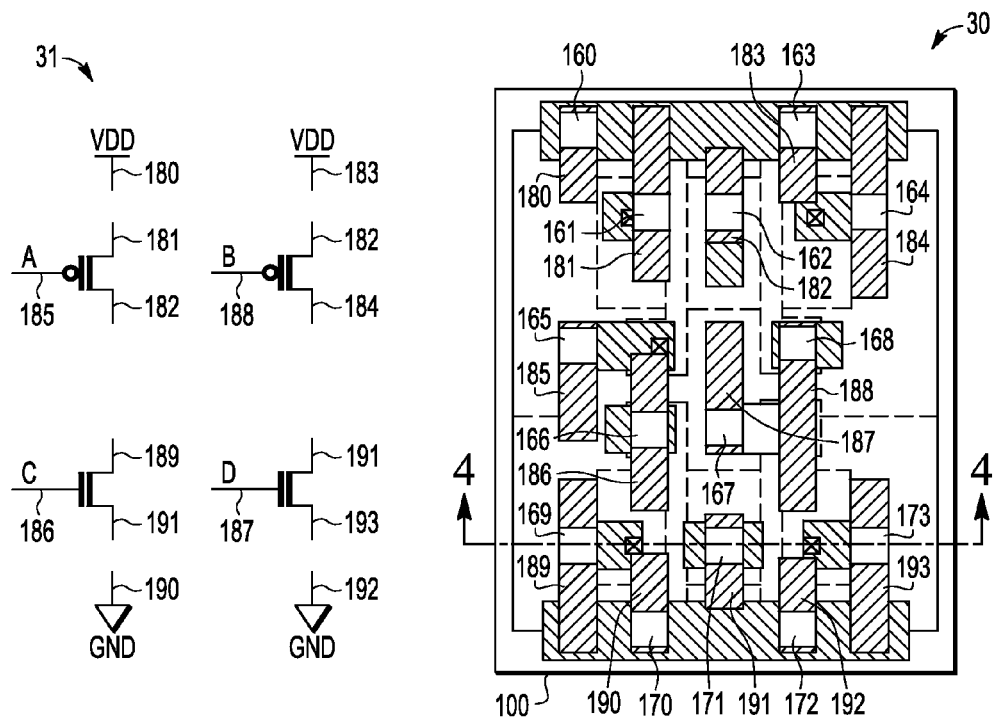
FIG. 3 depicts a simplified plan view of the first level vias and second metal layers for the first base cell configuration, along with an associated circuit schematic diagram.

Turning now to FIG. 3, there is depicted a simplified plan view 30 of the first level vias and second metal layers for the first base cell 100 in its unprogrammed configuration, along with an associated circuit schematic diagram 31 to depict the inherent circuit functionality of the base cell at this stage of manufacture. After forming one or more inter-layer or inter-metal dielectric layers (not shown), first level vias 160-173 are formed to provide electrical contact to the underlying patterned M1 layers 140-151 as shown, thereby providing separate electrical contact to the reference voltage conductors and gate, source, and drain terminals of the NMOS and PMOS transistors. As will be appreciated, the first level vias 160-173 may be formed with any desired process, such as by applying a photolithographic mask and etch process to define via openings in the dielectric layer(s), depositing one or more conductive layers to fill the via openings, and then polishing or removing the conductive layers to form the conductive vias 160-173. After the conductive vias 160-173 are formed, a plurality of patterned second metal (M2) layers 180-193 are formed to define a plurality of separate conductors to the reference voltage conductors and gate, source, and drain terminals of the NMOS and PMOS transistors. The patterned M2 layers 180-193 may be formed by using a patterned photoresist mask to selectively etch one or more deposited M2 layers, or by employing an additive patterning or a "Damascene" or any other desired fabrication process. In the corresponding circuit schematic diagram 31, the circuit elements are labeled to correspond to the patterned M2 layers 180-193 shown in the plan view 30, and show that NMOS and PMOS transistors are not connected together or to the reference voltage conductors. It is further noted that the depicted base cell 100 is not connected with another base cell initially.

Figure 4:
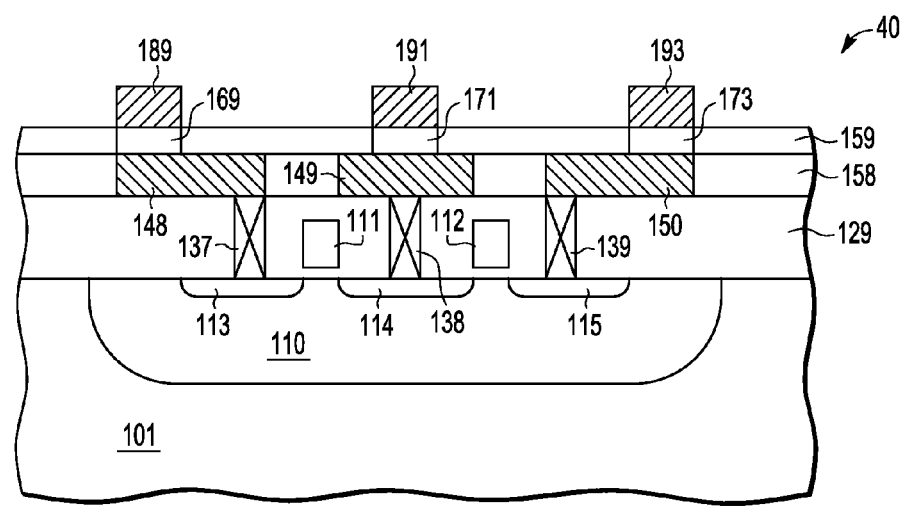
FIG. 4 is a simplified cross-sectional view of the first base cell configuration shown in FIG. 3.

For purposes of further describing the first base cell 100, reference is made to FIG. 4 which depicts a partial cross-sectional view 40 of the first base cell taken along the "FIG. 4" line shown in FIG. 3. As depicted, the first base cell 100 has pre-defined conductors up through the second metal (M2) layer. In particular, the pair of NMOS transistors are formed in the p-well 110 of the substrate 101 from the N+ implant regions 113-114 and plurality of gate electrode structures 111-112. The source/drain regions 113-115 for the NMOS transistors are each electrically connected to the outside world by separate conductors. For example, a first source/ drain region 113 is electrically connected to a first conductive contact 137 (formed in an initial dielectric layer 129), a first patterned M1 layer 148 (formed in an IMD dielectric layer 158), a first via conductor 169 (formed in an IMD dielectric layer 159), and a first patterned M2 layer 189. Likewise, the second source/drain region 114 is electrically connected to a second conductive contact 138, second patterned M1 layer 149, second via conductor 171, and a second patterned M2 layer 191, and the third source/drain region 115 is electrically connected to a second conductive contact 139, second patterned M1 layer 150, second via conductor 173, and a second patterned M2 layer 193. Though not shown in FIG. 4, each of the gate electrode structures 111-112 has its own separate electrical connection through the contacts 135-136, patterned M1 layers 146-147, vias 166-167, and patterned M2 layers 186-187. In addition, each of the reference voltage terminals (e.g., $V_{DD}$ and $V_{SS}$) has its own separate electrical connection through the patterned M1 layers 140, 151, vias 160, 163, 170, 172, and patterned M2 layers 180, 183, 190, 192.

As disclosed herein, the base cell 100 has pre-defined elements and conductor layers up to the second metal (M2) level. In selected embodiments, the pre-defined elements and conductor layers in the base cell are arranged to provide separate pull-up and pull-down networks to provide enhanced flexibility when choosing functionality, such as by providing electrically separate gate conductor elements for each transistor. Once any mask change is required to add logic circuitry as part of an ECO change, the changes may be implemented by programming the base cell into a desired circuit using the conductor layers beginning with the second via level to connect and configure the NMOS and PMOS transistors of the base cell. By confining the mask changes to begin at the second via level, the mask costs and cycle time are significantly reduced, as compared to implementing changes at the contact or first metal (M1) layer where the masks are typically very expensive and a critical layer for yield. In addition, the base cell (and any library constructed based on the base cell) could be fully characterized like a conventional cell library, thereby speeding up the timing required for ECO changes.

As disclosed herein, a base cell 100 may be transformed into a logic cell by adding extra conductive vias 201-222, 250-251 and patterned metal layers 230-240, 252 above the second metal (M2) level. The extra patterns in these upper level conductive layers may be used to route the transistors to form any desired logic functionality, including but not limited to an inverter, NAND, NOR, XOR, AOI, Buffer, multiplexer, latch, de-coupling capacitors (decap), etc. To illustrate how the base cell may be programmed into a logic cell, reference is now made to FIG. 5 which depicts a simplified plan view of a pair of base cells 100-1, 100-2 in which second level vias and third metal layers are provided to program a pair of first base cells into an AND-OR-Invert (AOI) logic gate. In particular, second level vias 201-222 are formed in one or more inter-metal dielectric layers (not shown) to provide electrical contact to selected ones of the underlying patterned M2 layers 180-193 in accordance with the desired logic circuit programming as shown. As will be appreciated, the second level vias 201-222 may be formed with any desired process. After the conductive vias 201-222 are formed, a plurality of patterned third metal (M3) layers 230-240 are formed using any desired process to provide electrical connection between selected pairs of the second level vias 201-222 in accordance with the desired logic circuit programming as shown. To complete the desired logic circuit function, an additional layer of conductors is added as illustrated in FIG. 6 which depicts a simplified plan view of the third level vias and fourth metal layers which are provided to program the pair of first base cells into the AOI logic gate. In particular, third level vias 250-251 are formed in one or more inter-metal dielectric layers (not shown) using any desired process to provide electrical contact to selected ones of the underlying patterned M3 layers (e.g., 233, 238) in accordance with the desired logic circuit programming as shown. After the conductive vias 250-251 are formed, one or more patterned fourth metal (M4) layers 252 are formed using any desired process to provide electrical connection between selected pairs of the second level vias 250-251 in accordance with the desired logic circuit programming as shown.

Figure 5:
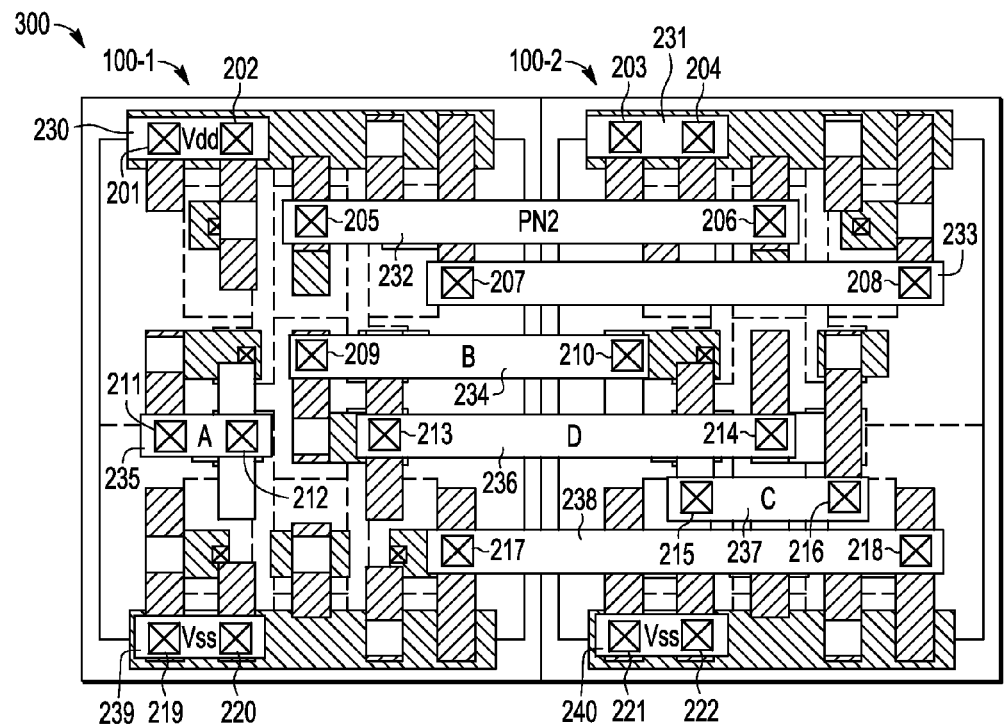
FIG. 5 depicts a simplified plan view of the second level vias and third metal layers which are provided to program a pair of first base cells into an AND-OR-Invert (AOI) logic gate.
Figure 6:
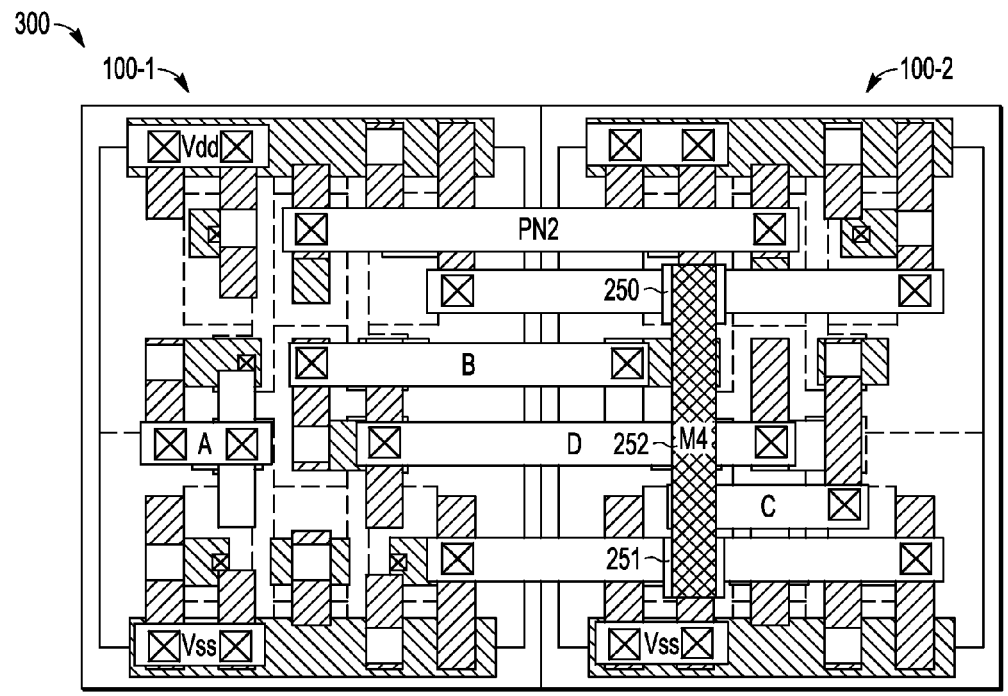
FIG. 6 depicts a simplified plan view of the third level vias and fourth metal layers which are provided to program the pair of first base cells into the AOI logic gate.
Figure 7:
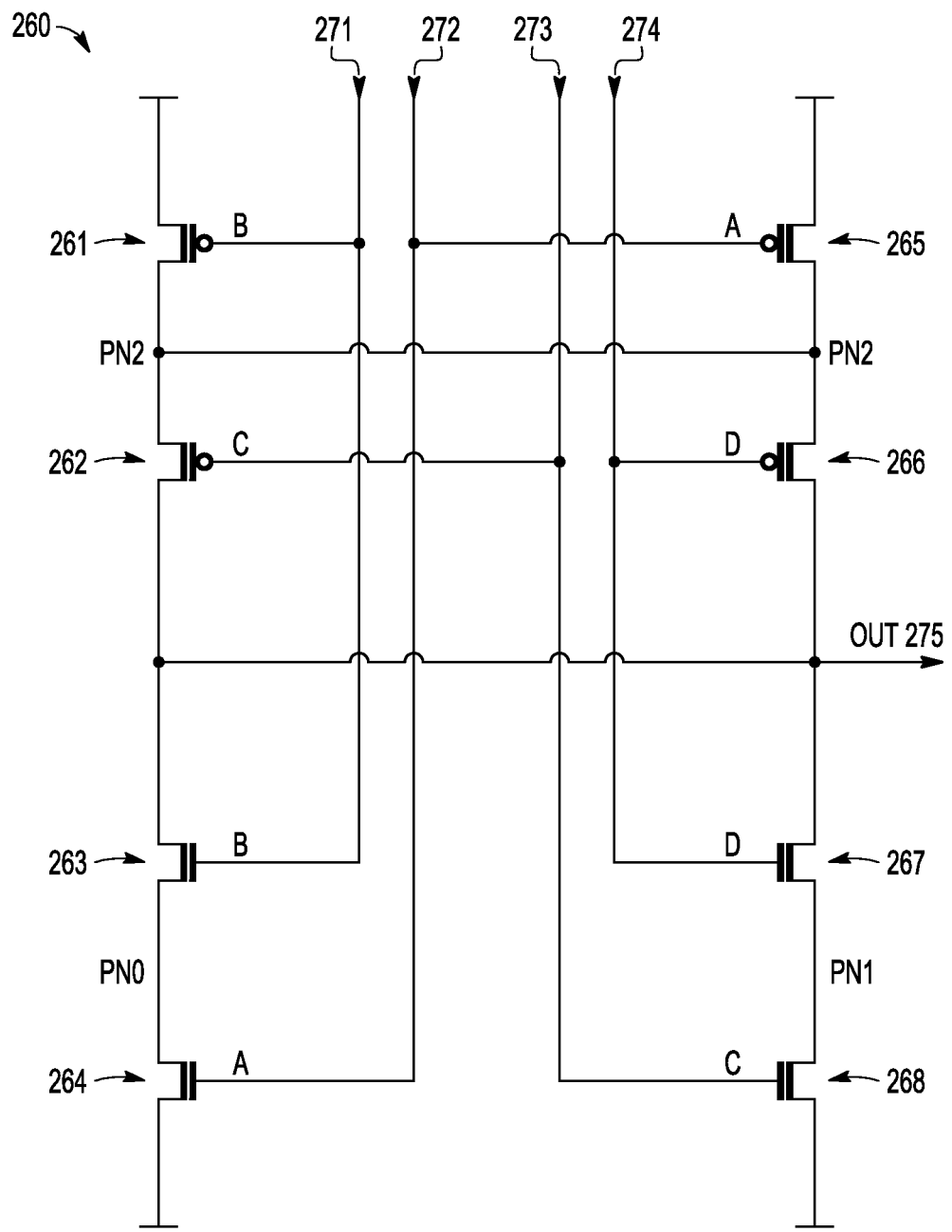
FIG. 7 illustrates a simplified circuit schematic diagram of the AOI logic gate shown in FIG. 6.

The result of adding the extra conductive vias 201-222, 250-251 and patterned metal layers 230-240, 252 is that the transistors in the base cell pair 100-1, 100-2 are effectively connected to form an AOI logic gate 260 as shown in FIG. 7 which depicts the corresponding circuit schematic elements labeled to correspond to the patterned M3 layers shown in FIGS. 5-6. As depicted, the NMOS and PMOS transistors 261-268 from the base cell pair are connected together and to the reference voltages $V_{DD}$ and $V_{SS}$ as shown to receive inputs 271-274 which are applied to the gate nodes a-d, and generate the depicted AND-OR-Invert (AOI) logic gate output 275. However, it will be appreciated that different patterns of routing in one or more upper level conductive layers (namely, above M2) may be used to route the transistors to form any desired logic functionality, including but not limited to an inverter, NAND, NOR, XOR, AOI, Buffer, multiplexer, latch, de-coupling capacitors (decap), etc.

As described hereinabove, one or more base cells may be provided which have predefined substrate design and fixed conductor stack up to the second metal layer such that the transistor electrodes and power supply terminals are all electrically separated from one another. However, other base cell configurations may also be provided in which the transistors (e.g., NMOS and PMOS transistors) and a reference voltage terminals (e.g., $V_{DD}$ and $V_{SS}$) are electrically connected at or below the second metal (M2) layer to form one or more circuit elements that may be connected together in the conductors above the second metal layer to provide a desired circuit functionality during the ECO redesign process. While the resulting base cell with predefined circuit elements has reduced programming flexibility, the required circuit area is reduced since there are fewer upper level conductors that must be accounted for in the design and layout of the circuit routing.

Figure 8:
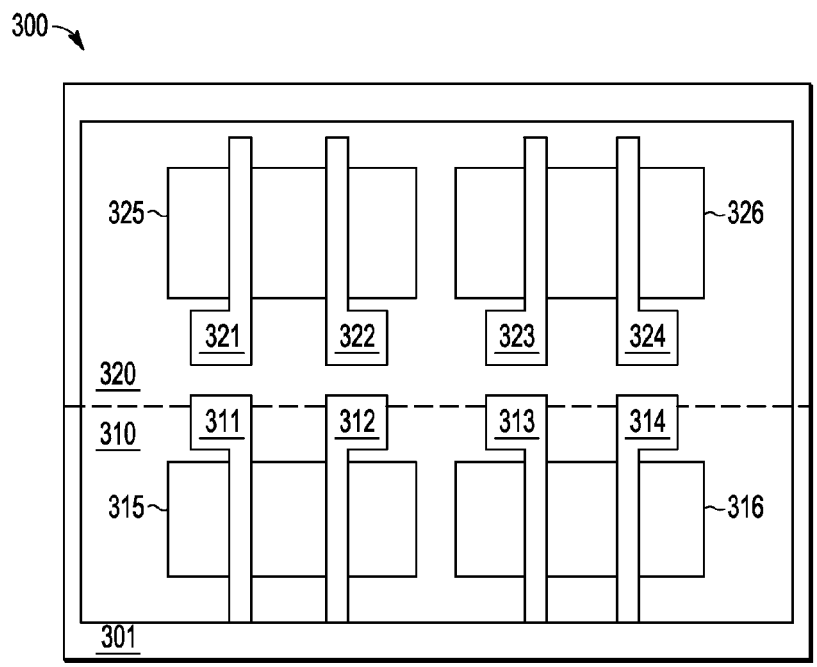
FIG. 8 depicts a simplified plan view of the substrate regions and patterned gate conductors for a second base cell configuration.

To illustrate an example of another base cell configuration having predefined circuit elements, reference is now made to FIG. 8 which depicts a simplified plan view of the substrate regions 315-316, 325-326 and patterned gate conductors 311-314, 321-324 for a second base cell 300. Again, the shapes and patterns in different material layers and regions may be formed separately with any desired manufacturing processes, including but not limited to implantation, doping, deposition, photolithography, selective masking, etching, etc. In the second base cell 300, NMOS transistors and PMOS transistors are formed in the substrate 301 by first forming separate p-well 310 and n-well 320 regions. In the p-well region 310, NMOS transistors may be formed by first forming a plurality of gate electrode structures 311-314 with patterned gate conductor and dielectric layers, and then using the gate electrode structures 311-314, alone or in combination with sidewall spacers (not shown), to implant the N+ source/drain regions 315-316. In similar fashion, PMOS transistors may be formed using the defined plurality of gate electrode structures 321-324, alone or in combination with sidewall spacers (not shown), to implant the P+ source/drain regions 325-326 in the n-well region 320. By separately defining the NMOS gate electrodes 311-314 and PMOS gate electrodes 321-324, the second base cell defines separate pull-up and pull-down networks, thereby providing increased flexibility when programming the base cell. As depicted, the PMOS and NMOS transistors formed by the gate electrode structures 311-314, 321-324 and implant regions 315-316, 325-326 are electrically separate elements not yet connected to any reference voltages.

Figure 9:
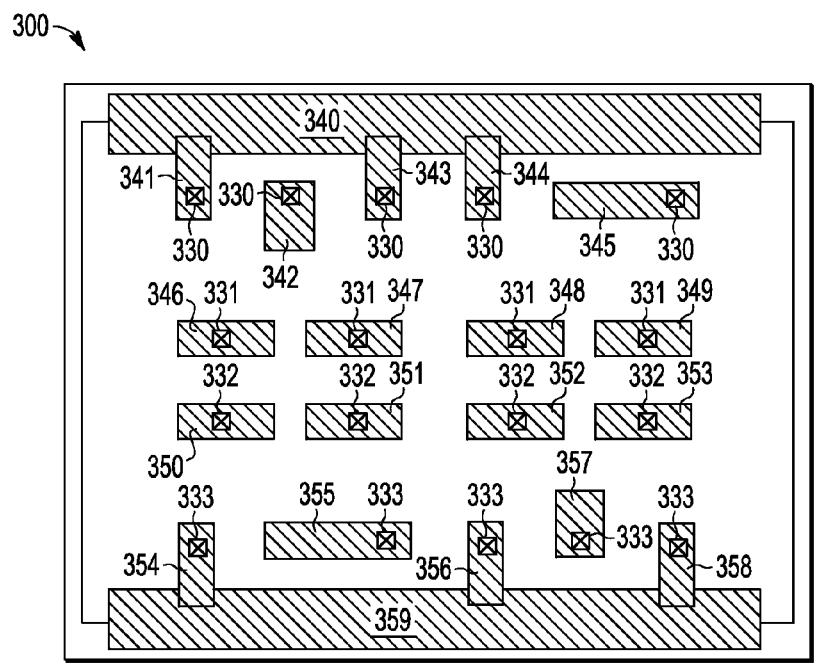
FIG. 9 depicts a simplified plan view of the contact vias and first metal layers for the second base cell configuration.

In FIG. 9, there is depicted a simplified plan view of the conductive contacts 330-333 and first metal layers 340-359 for the second base cell 300. Prior to forming the conductive contacts 330-333, one or more dielectric layers (not shown) are formed over the substrate and gate electrode structures, such as by depositing and planarizing one or more passivation layers and/or inter-layer dielectric (ILD) layers. In the initial dielectric layer(s), conductive contacts 330-333 are formed in the second base cell using any desired process (e.g., photolithographic mask and etch, followed by depositing and polishing one or more conductive contact layers) to provide electrical contact to the underlying gate, source, and drain terminals of the NMOS and PMOS transistors. After forming the conductive contacts 330-333, a plurality of first metal (M1) layers are formed to define a plurality of reference voltage conductors 340, 359 (e.g., $V_{DD}$ and $V_{SS}$) which provide the voltage supplies from a plurality of DC power sources. In addition, the patterned M1 layers 341-358 are formed using any desired process (e.g., mask and etch or Damascene-type processes) to provide electrical contact to the underlying contacts to the gate, source, and drain terminals of the NMOS and PMOS transistors. As depicted, selected ones of the NMOS and PMOS transistors are connected to the reference voltage conductors 340, 359 (e.g., $V_{DD}$ and $V_{SS}$) by the patterned M1 layers 341, 343, 344, 354, 356, 358, but are otherwise not connected together. For example, patterned M1 layers 340, 341, and 343 electrically connect together the source terminals of the PMOS transistors formed by gate electrodes 321 and 322.

Figure 10:
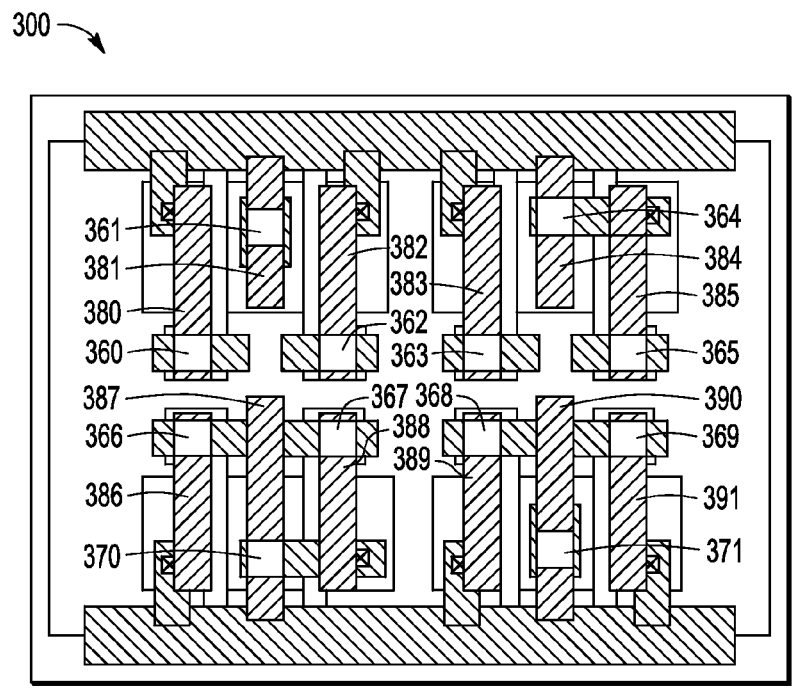
FIG. 10 depicts a simplified plan view of the first level vias and second metal layers for the second base cell configuration.

Turning now to FIG. 10, there is depicted a simplified plan view of the first level vias and second metal layers for the second base cell 300. After forming one or more inter-layer or inter-metal dielectric layers (not shown), first level vias 360-371 are formed to provide electrical contact to the underlying patterned M1 layers 346, 342, 347-348, 345, 349, 350-353, 355, and 357, respectively. As will be appreciated, the first level vias 360-371 may be formed with any desired process, such as by applying a photolithographic mask and etch process to define via openings in the dielectric layer(s), depositing one or more conductive layers to fill the via openings, and then polishing or removing the conductive layers to form the first level vias 360-371. Thus formed, the first level vias 360-371 provide separate electrical contact to the reference voltage conductors and selected gate, source, and drain terminals of the NMOS and PMOS transistors, thereby connecting selected transistors to one another. After forming the conductive first level vias 360-371, a plurality of patterned second metal (M2) layers 380-391 are formed to connect selected ones of the reference voltage conductors and gate, source, and drain terminals of the NMOS and PMOS transistors to thereby define the plurality of predefined circuit elements. The patterned M2 layers 380-391 may be formed by using a patterned photoresist mask to selectively etch one or more deposited M2 layers, or by employing an additive patterning or a "Damascene" or any other desired fabrication process. As depicted, the patterned M2 layers 380-391 electrically connect selected ones of the NMOS and PMOS transistors to the reference voltage conductors 340, 359 (e.g., $V_{DD}$ and $V_{SS}$) to form the one or more circuit elements that may be further programmed with upper layer metal layers. For example, patterned M2 layers 380 and 382 provide separate gate inputs to the PMOS transistors formed by gate electrodes 321 and 322, while patterned M2 layer 381 provides an output conductor that electrically connects the drains of the PMOS transistors formed by gate electrodes 321 and 322.

Figure 11:
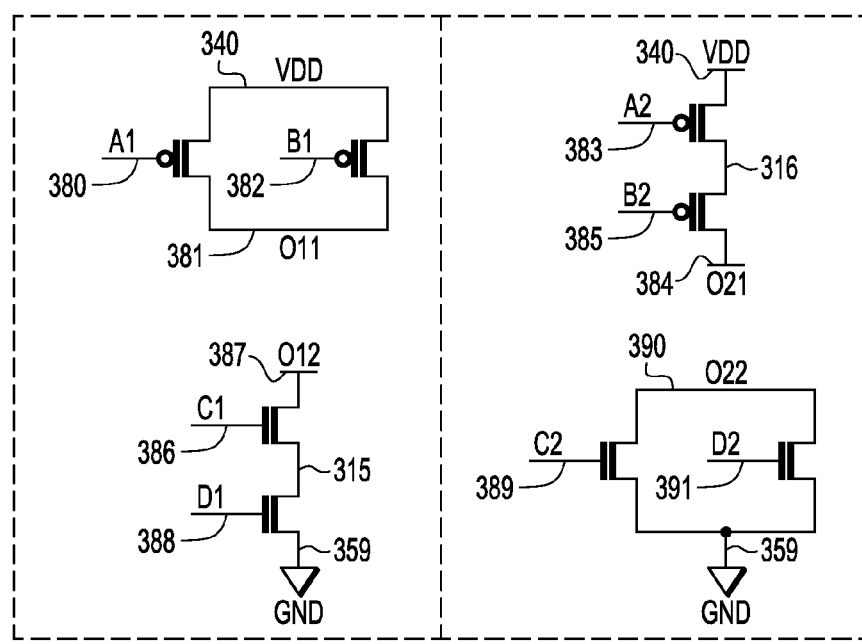
FIG. 11 depicts a simplified circuit schematic diagram of the second base cell configuration shown in FIG. 10.

To show how the predefined circuit elements are formed in the example second base cell 300, reference is now made to FIG. 11 which depicts a simplified circuit schematic diagram of the second base cell configuration shown in FIG. 10 with the circuit elements labeled to correspond to the patterned M2 layers 380-391. In this example, the PMOS transistors formed with gate electrode-connected conductors 380, 382 (connected, respectively, to gate electrode structures 321-322) are connected in parallel between the reference voltage conductor 340/341/343 and drain-connected conductor 381 to define a PMOS NAND gate, and the PMOS transistors formed with gate electrode-connected conductors 383, 385 are connected in series between the reference voltage conductor 340/344 and drain-connected conductor 384 to define a PMOS NOR gate. In addition, the NMOS transistors formed with gate electrode-connected conductors 386, 388 are connected in series between the drain-connected conductor 387 and reference voltage conductor 354/359 to define an NMOS NAND gate, and the NMOS transistors formed with gate electrode-connected conductors 389, 391 are connected in parallel between the drain-connected conductor 390 and the reference voltage conductor 356/358/359 to define an NMOS NOR gate.

Figure 13:
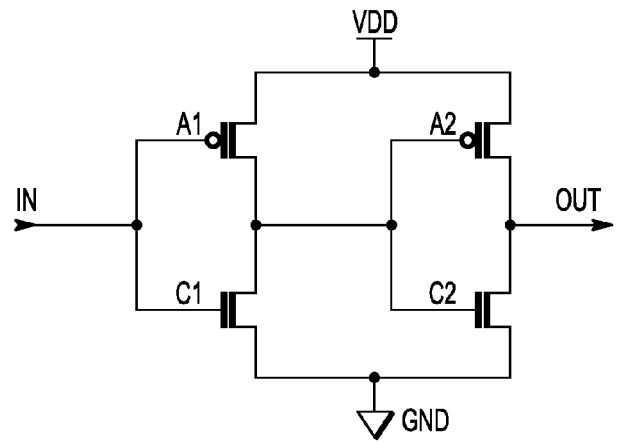
FIG. 13 shows an example circuit schematic of a buffer circuit.
Figure 14:
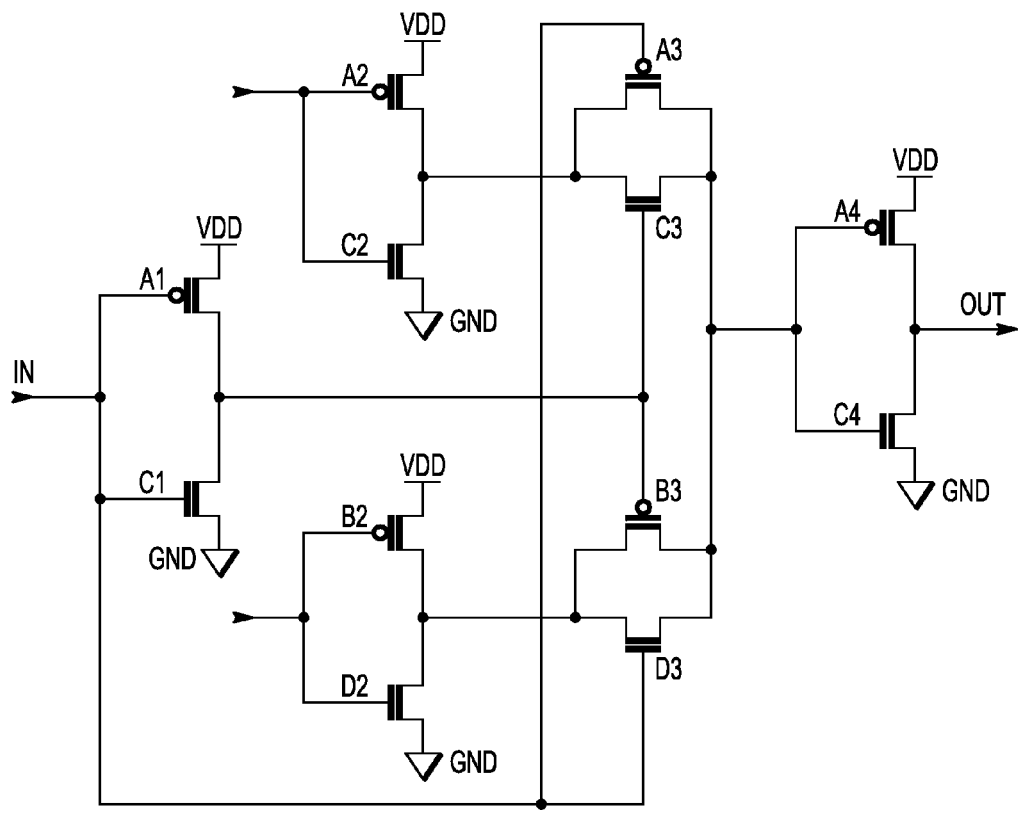
FIG. 14 shows an example circuit schematic of a multiplexer circuit.
Figure 15:
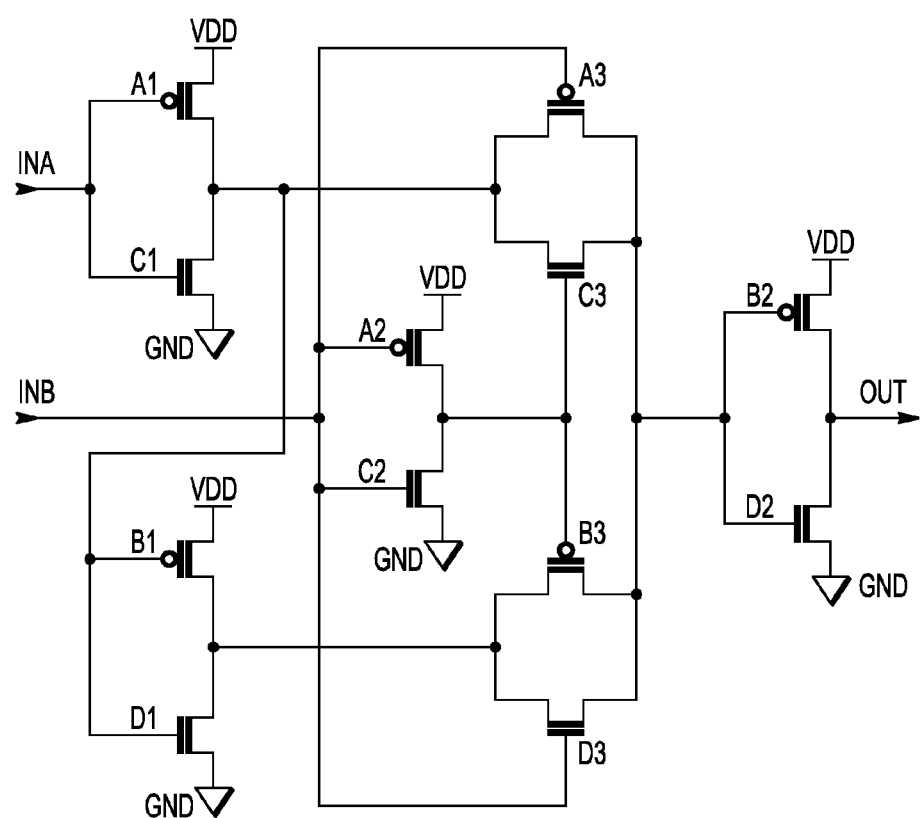
FIG. 15 shows an example circuit schematic of an XOR logic gate circuit.
Figure 16:
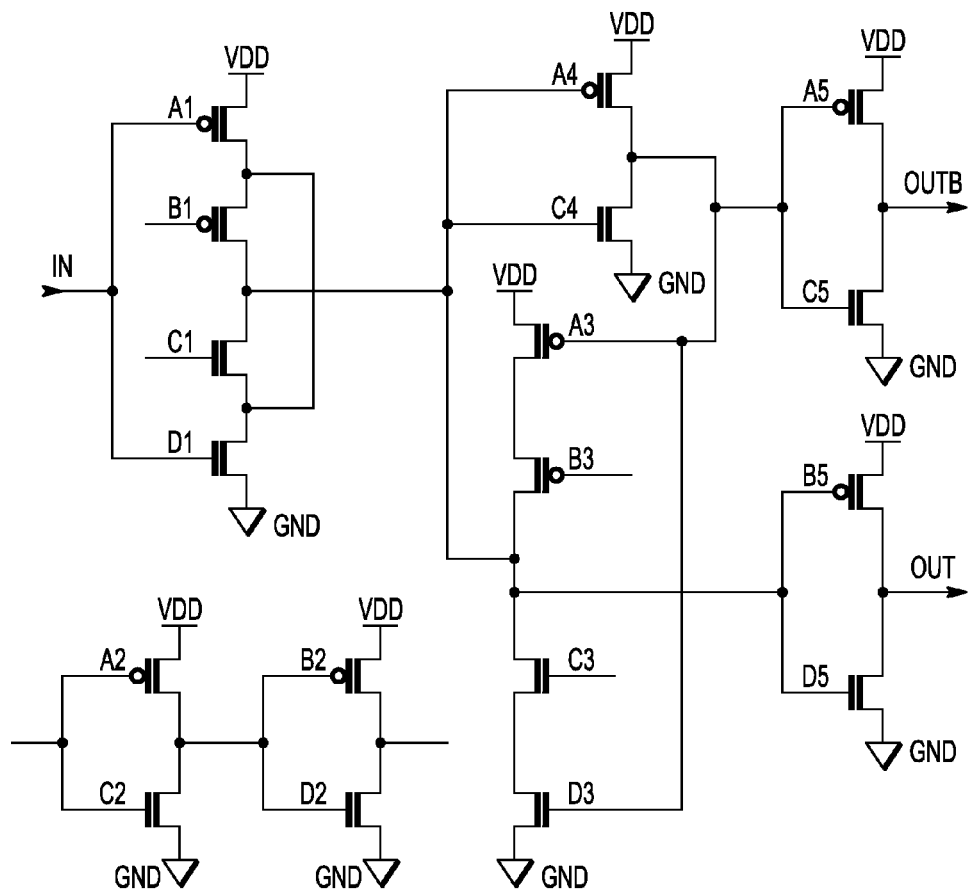
FIG. 16 shows an example circuit schematic of a latch circuit.
Figure 17:
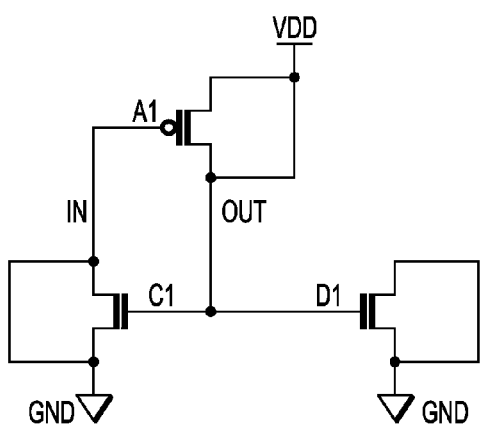
FIG. 17 shows an example circuit schematic of a decoupling capacitor.

As will be appreciated, the predefined circuit elements in the second base cell can be programmed and connected with the upper level conductors (e.g., above M2) to form a variety of different circuit configurations to meet any engineering change order requirements. For example, using the upper level via conductors (V2 and V3) and selected patterned conductors in the third metal (M3) and fourth metal (M4) layers, the second base cell may be programmed into targeted logic cells, such as an inverter, NAND, NOR, XOR, AOI, buffer, multiplexer, latch, de-coupling capacitors (decap), etc. The placement of the upper level conductors over the second base cell to connect the predefined circuit elements in the second base cell takes into account the circuit node functionality of the patterned second metal (M2) layers 380-391. For example, the placement of the upper level conductors is fairly straightforward for the NAND and NOR logic gate circuits since their functionality is already embedded in the second base cell. In particular, the patterned M2 layer 380 is the gate input A1, patterned M2 layer 382 is the gate input B1, and patterned M2 layer 381 is the PMOS NAND gate output O11. Likewise, the patterned M2 layer 386 is the gate input C1, patterned M2 layer 388 is the gate input D1, and patterned M2 layer 387 is the nMOS NAND gate output O12. With this understanding of the circuit node functionality of the second base cell, an inverter may be formed using second level vias (V2) and patterned third metal (M3) layers to connect the PMOS gate input A1 (patterned M2 layer 380) to the PMOS NOR gate output O21 (patterned layer 384), to connect the NMOS gate input C1 (patterned M2 layer 386) to the NMOS NOR gate output O22 (patterned layer 390), and to form an inverter output by connecting the PMOS gate input B1 (patterned M2 layer 382) to the PMOS gate input B2 (patterned M2 layer 385), where an inverter input is formed with third level vias (V3) and patterned fourth metal (M4) layers which connect the PMOS gate input A1 (patterned M2 layer 380) to the NMOS gate input C1 (patterned layer 386). In similar fashion, persons skilled in the art will readily understand how to place the upper level conductors to form AOI logic gate circuits (such as shown in FIG. 7), buffer circuits (such as shown in FIG. 13), multiplexer circuits (such as shown in FIG. 14), XOR logic gate circuits (such as shown in FIG. 15), latch circuits (such as shown in FIG. 16), and decoupling capacitors (such as shown in FIG. 17).

Figure 12:
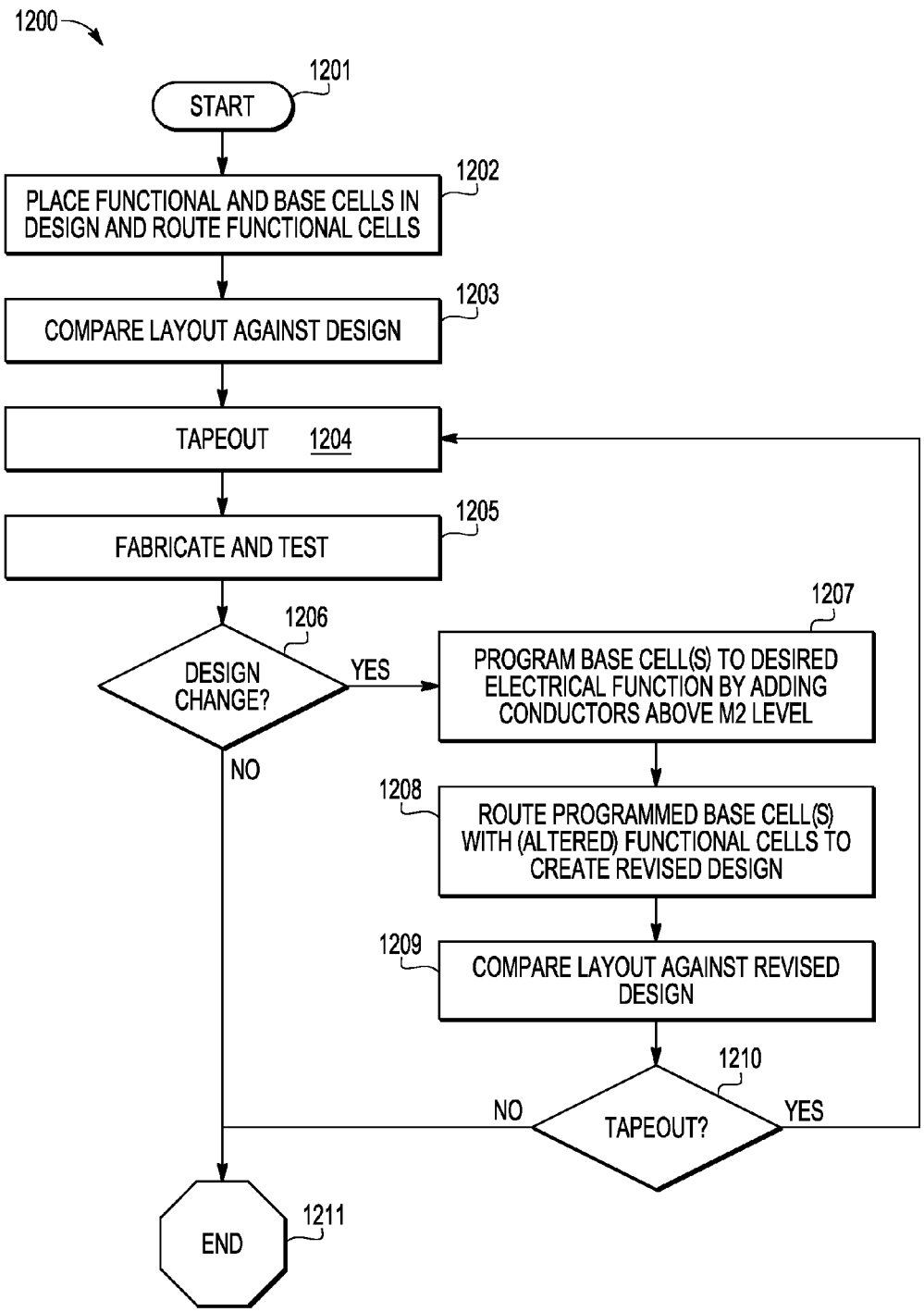
FIG. 12 shows an example process flow for implementing a design change using the reconfigurable ECO base cell(s) in accordance with selected embodiments.

In accordance with various embodiments of the present invention, a methodology is provided for changing a circuit design using reconfigurable base cells. While details of the methodology will vary from one embodiment to another, FIG. 12 shows an example process flow 1200 for implementing an engineering change order design change using reconfigurable ECO base cells. Though selected embodiments of the test sequence are illustrated in FIG. 12, it will be appreciated that the sequence of illustrated steps may be modified, reduced or augmented in keeping with the disclosure of the present invention. For example, one or more of the steps may optionally be included, excluded or combined. Thus, it will be appreciated that the methodology of the present invention may be thought of as performing the identified sequence of steps in the order depicted in FIG. 12, though the steps may also be performed in parallel, in a different order, or as independent operations that are combined.

As depicted, the methodology begins at step 1201, where one or more standard functional cells and (un-programmed) base cells are placed and routed according to the needs of the preliminary design file. In selected embodiments, the base cells may be placed in spare regions of the circuit, and the standard cells are routed to form one or more functional cells, leaving one or more base cells as spare or preserved cells. At step 1203, the layout is compared against the preliminary design file. To form masks for semiconductor processing, the design proceeds to tapeout at step 1204 where the layout is used to define semiconductor processing steps (e.g., depositing, masking, and etching) for making the design. At step 1205, the design is fabricated and tested. Based on the test results, a determination is made at step 1206 on whether the design needs a revision. If the design does not need to be changed, the flow ends (step 1211). However, if the design needs to be changed and the base cells can be used for the change, at least one spared base cell is programmed by adding at least one of the upper metal layers above the M2 at step 1207 to provide additional circuit functionality. In step 1208, the functional cells (which may themselves be altered) are re-routed with the programmed base cells. In the step 1209, the layout is further compared with the revised design. At step 1210, it is determined if the flow needs further tape-out. If further tape-out is required, the flow goes back to the step 1204, but if no further tape-out is required, the flow ends at step 1211.

By now it should be appreciated that there is provided herein a configured base cell module and methodology for manufacturing same which may be used to implement an engineering change order (ECO). The configured base cell module includes a plurality of base cells, each having a fixed circuit structure through a second metal (M2) layer. In each base cell, a substrate has n-well and p-well regions formed therein with PMOS and NMOS gate electrode structures formed over the n-well and p-well and electrically separated from another up to the second metal (M2) layer. In addition, P+ implant and N+ implant regions are formed in the n-well and p-well, and first and second power supply lines are formed over the n-well and p-well and electrically separated from another up to the second metal (M2) layer. Over a first base cell, one or more conductor elements are formed above the M2 layer to configure the first base cell to provide a predetermined circuit function, such as inverter, NAND, NOR, XOR, AOI, Buffer, multiplexer, latch, de-coupling capacitors (decap), etc. In selected embodiments, a second base cell is provided that has the fixed circuit structure through the second metal (M2) layer, but without one or more conductor elements formed over the second base cell above the M2 layer to configure the second base cell to provide a predetermined circuit function. In this case, the second base cell not used, and the predetermined circuit function is the fixed circuit structure for the second base cell that is not reconfigured. In other embodiments, the fixed circuit structure includes electrically separated PMOS and NMOS transistors, where the PMOS transistor includes a PMOS gate electrode structure with electrically separate conductor paths to gate, source and drain terminals of the PMOS transistor formed up to the second metal (M2) layer; and where the NMOS transistor includes an NMOS gate electrode structure with electrically separate conductor paths to gate, source and drain terminals of the NMOS transistor formed up to the second metal (M2) layer. In other embodiments, the fixed circuit structure includes a plurality of PMOS transistors formed with PMOS gate electrode structures and connected together and to the first power supply line at or below the second metal (M2) layer to form a PMOS NAND logic gate circuit and/or PMOS NOR logic gate circuit. The fixed circuit structure may also include a plurality of NMOS transistors formed with NMOS gate electrode structures and connected together and to the second power supply line at or below the second metal (M2) layer to form a NMOS NAND logic gate circuit and/or NMOS NOR logic gate circuit.

In another form, there is provided a programmed base cell module and methodology for using same to construct integrated circuit devices. As disclosed, the base cell module includes at least one PMOS transistor which has a PMOS gate electrode and p-type source and drain regions with a fixed conductor path to the PMOS gate electrode formed up to the second metal (M2) layer. The base cell module also includes at least one NMOS transistor having an NMOS gate electrode and n-type source and drain regions with a fixed conductor path to the NMOS gate electrode formed up to the second metal (M2) layer. As formed, the NMOS gate electrode is electrically disconnected from the PMOS gate electrode up to the second metal (M2) layer. There are also first and second reference voltage conductor lines formed in the base cell module with one or more first conductor paths formed up to the second metal (M2) layer, where the second reference voltage conductor line is electrically disconnected from the first reference voltage conductor line up to the second metal (M2) layer. As formed, the base cell module has a fixed circuit structure through the second metal (M2) layer. In selected embodiments, the fixed circuit structure includes one or more PMOS transistors and one or more NMOS transistors, each having gate, source and drain terminals that are electrically separate from one another up to the second metal (M2) layer. In other embodiments, the fixed circuit structure includes NMOS and PMOS transistors. As formed, the PMOS transistors include PMOS gate electrodes and are connected together and to the first reference voltage conductor line at or below the second metal (M2) layer to form a PMOS NAND logic gate circuit and/or a PMOS NOR logic gate circuit. In addition, the NMOS transistors include NMOS gate electrodes and are connected together and to the second power supply line at or below the second metal (M2) layer to form a NMOS NAND logic gate circuit and/or a NMOS NOR logic gate circuit, where the NMOS gate electrodes are electrically separate from the PMOS gate electrodes. In any case, the fixed circuit structure of the base cell module may be reconfigured with one or more conductor elements formed above the M2 layer to form a predetermined circuit function. For example, by forming patterned conductor layers in one or more metal layers above the second metal (M2) layer, the base cell module may be reconfigured to form an inverter circuit, buffer circuit, a multiplexer circuit, an AND-OR-Invert (AOI) logic gate circuit, a NAND logic gate circuit, a NOR logic gate circuit, an XOR logic gate circuit, a latch circuit, or a de-coupling capacitor circuit.

In yet another form, there is provided a method for making an integrated circuit device by implementing changes to a device layout design. In the disclosed methodology, one or more functional cells and one or more base cells are placed in a preliminary layout design, where each base cell includes a plurality of electrically separate gate electrode structures in a fixed circuit structure through the second metal (M2) layer. As formed, each base cell may include an n-well and p-well formed in a substrate; PMOS and NMOS gate electrode structures formed over the n-well and p-well and electrically separated from another up to the second metal (M2) layer; and P+ implant and N+ implant regions formed in the n-well and p-well, respectively. In addition, the fixed circuit structure may form one or more PMOS transistors and one or more NMOS transistors, each having gate, source and drain terminals that are electrically separate from one another up to the second metal (M2) layer. Alternative, the fixed circuit structure may form a plurality of PMOS transistors formed with PMOS gate electrode structures and connected together and to the first power supply line at or below the second metal (M2) layer to form a PMOS NAND logic gate circuit and/or PMOS NOR logic gate circuit; and a plurality of NMOS transistors formed with NMOS gate electrode structures and connected together and to the second power supply line at or below the second metal (M2) layer to form a NMOS NAND logic gate circuit and/or NMOS NOR logic gate circuit. After routing the one or more functional cells according to the preliminary layout design, it is determined that additional functional cells are needed in the design. To add more functional cells, at least one metal layer above the second metal (M2) layer is altered in one or more of the base cells to form one or more programmed functional cells, each having a predetermined circuit function, and then the one or more functional cells are re-routed to be integrated with the one or more programmed functional cells. To alter the metal layer (s), a metal via and/or conductor layer above the second metal (M2) layer may be altered. With the fixed circuit structures formed through the M2 layer, the base cells can have the same features or element configurations (e.g., the same layout pitch) as the functional cells up through the second metal (M2) layer. The finalized device layout design is used to make an integrated circuit device.

Although the described exemplary embodiments disclosed herein are directed to selected base cell configurations and associated methods for using same to implement engineering change orders, the present invention is not necessarily limited to the example embodiments which illustrate inventive aspects of the present invention that are applicable to a wide variety of programmable base cell configurations. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A configured base cell module comprising:
a plurality of base cells, each having a fixed circuit structure through a second metal (M2) layer and comprising:
an n-well and a p-well formed in a substrate,
PMOS and NMOS gate electrode structures formed over the n-well and p-well and electrically separated from another up to the second metal (M2) layer,
P+ implant and N+ implant regions formed adjacent to the PMOS and NMOS gate electrode structures in the n-well and p-well, respectively, and
first and second power supply lines formed over the n-well and p-well and electrically separated from another up to the second metal (M2) layer; and
one or more conductor elements formed over a first base cell above the M2 layer to configure the first base cell to provide a predetermined circuit function.

2. The configured base cell module of claim 1, where the predetermined circuit function is an inverter circuit.

3. The configured base cell module of claim 1, where the predetermined circuit function is a buffer circuit.

4. The configured base cell module of claim 1, where the predetermined circuit function is a multiplexer circuit.

5. The configured base cell module of claim 1, where the predetermined circuit function is an AND-OR-Invert (AOI) logic gate circuit.

6. The configured base cell module of claim 1, where the predetermined circuit function is a NAND logic gate circuit, NOR logic gate circuit, XOR logic gate circuit, latch circuit, or de-coupling capacitor circuit.

7. The configured base cell module of claim 1, further comprising a second base cell having the fixed circuit structure through the second metal (M2) layer without one or more conductor elements formed over the second base cell above the M2 layer to configure the second base cell to provide a predetermined circuit function.

8. The configured base cell module of claim 1, where the fixed circuit structure comprises:
at least one PMOS transistor formed with a PMOS gate electrode structure and having electrically separate conductor paths to gate, source and drain terminals of the PMOS transistor formed up to the second metal (M2) layer; and
at least one NMOS transistor formed with an NMOS gate electrode structure and having electrically separate conductor paths to gate, source and drain terminals of the NMOS transistor formed up to the second metal (M2) layer.

9. The configured base cell module of claim 1, where the fixed circuit structure comprises:

a plurality of PMOS transistors formed with PMOS gate electrode structures and connected together and to the first power supply line at or below the second metal (M2) layer to form a PMOS NAND logic gate circuit and/or PMOS NOR logic gate circuit; and a plurality of NMOS transistors formed with NMOS gate electrode structures and connected together and to the second power supply line at or below the second metal (M2) layer to form a NMOS NAND logic gate circuit and/or NMOS NOR logic gate circuit.

10. The configured base cell module of claim 1, where the plurality of base cells comprises a first base cell configured with one or more conductor elements formed above the M2 layer to provide a first circuit function, and a second base cell configured with one or more conductor elements formed above the M2 layer to provide a second different circuit function.

11. A programmed base cell module comprising:
at least one PMOS transistor comprising a PMOS gate electrode and p-type source and drain regions with a fixed conductor path to the PMOS gate electrode formed up to a second metal (M2) layer;
at least one NMOS transistor comprising an NMOS gate electrode and n-type source and drain regions with a fixed conductor path to the NMOS gate electrode formed up to the second metal (M2) layer, where the NMOS gate electrode is electrically disconnected from the PMOS gate electrode up to the second metal (M2) layer;
a first reference voltage conductor line with one or more first conductor paths formed up to the second metal (M2) layer;
a second reference voltage conductor line with one or more second conductor paths formed up to the second metal (M2) layer, where the second reference voltage conductor line is electrically disconnected from the first reference voltage conductor line up to the second metal (M2) layer; and
one or more conductor elements formed above the second metal (M2) layer;
where the programmed base cell module has a fixed circuit structure through the second metal (M2) layer and where the one or more conductor elements formed above the second metal (M2) layer program the fixed circuit structure to form a predetermined circuit function.

12. The programmed base cell module of claim 11, where the one or more conductor elements comprise patterned conductor layers formed in one or more metal layers above the second metal (M2) layer to form an inverter circuit, buffer circuit, a multiplexer circuit, an AND-OR-Invert (AOI) logic gate circuit, a NAND logic gate circuit, a NOR logic gate circuit, an XOR logic gate circuit, a latch circuit, or a de-coupling capacitor circuit.

13. The programmed base cell module of claim 11, where the fixed circuit structure comprises one or more PMOS transistors and one or more NMOS transistors, each having gate, source and drain terminals that are electrically separate from one another up to the second metal (M2) layer.

14. The programmed base cell module of claim 11, where the fixed circuit structure comprises:
a plurality of PMOS transistors formed with PMOS gate electrodes and connected together and to the first reference voltage conductor line at or below the second metal (M2) layer to form a PMOS NAND logic gate circuit and/or a PMOS NOR logic gate circuit; and
a plurality of NMOS transistors formed with NMOS gate electrodes and connected together and to the second power supply line at or below the second metal (M2) layer to form a NMOS NAND logic gate circuit and/or a NMOS NOR logic gate circuit, where the NMOS gate electrodes are electrically separate from the PMOS gate electrodes.

15. A method for making an integrated circuit device comprising:
placing one or more functional cells and one or more base cells in a preliminary layout design, where each base cell comprises a plurality of electrically separate gate electrode structures in a fixed circuit structure through the second metal (M2) layer;
routing the one or more functional cells according to the preliminary layout design;
altering at least one metal layer above the second metal (M2) layer in one or more base cells to form one or more programmed functional cells, each having a predetermined circuit function;
re-routing the one or more functional cells to be integrated with the one or more programmed functional cells to produce a device layout design; and
making an integrated circuit device using the device layout design.

16. The method of claim 15, where altering at least one metal layer comprises altering a metal conductor and/or via layer above the second metal (M2) layer.

17. The method of claim 15, where the one or more base cells have the same features or element configurations as the one or more functional cells up through the second metal (M2) layer.

18. The method of claim 15, where the one or more base cells have the same layout pitch as the one or more functional cells up through the second metal (M2) layer.

19. The method of claim 15, where each base cell comprises an n-well and p-well formed in a substrate; PMOS and NMOS gate electrode structures formed over the n-well and p-well and electrically separated from another up to the second metal (M2) layer; and P+ implant and N+ implant regions formed in the n-well and p-well, respectively.

20. The method of claim 15, where each base cell having the fixed circuit structure comprises one or more PMOS transistors and one or more NMOS transistors, each having gate, source and drain terminals that are electrically separate from one another up to the second metal (M2) layer.

21. The method of claim 15, where each base cell having the fixed circuit structure comprises:
a plurality of PMOS transistors formed with PMOS gate electrode structures and connected together and to the first power supply line at or below the second metal (M2) layer to form a PMOS NAND logic gate circuit and/or PMOS NOR logic gate circuit; and
a plurality of NMOS transistors formed with NMOS gate electrode structures and connected together and to the second power supply line at or below the second metal (M2) layer to form a NMOS NAND logic gate circuit and/or NMOS NOR logic gate circuit.

* * * * *